US010615261B2

(12) United States Patent
Cohen et al.

(10) Patent No.: US 10,615,261 B2
(45) Date of Patent: Apr. 7, 2020

(54) P-N JUNCTION BASED DEVICES WITH SINGLE SPECIES IMPURITY FOR P-TYPE AND N-TYPE DOPING

(71) Applicant: International Business Machines Corporation, Armonk, NY (US)

(72) Inventors: Guy M. Cohen, Westchester, NY (US); Paul M. Solomon, Westchester, NY (US); Christian Lavoie, Pleasantville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/417,985

(22) Filed: May 21, 2019

(65) Prior Publication Data

US 2020/0035793 A1 Jan. 30, 2020

Related U.S. Application Data

(62) Division of application No. 16/049,027, filed on Jul. 30, 2018, now Pat. No. 10,411,101.

(51) Int. Cl.
| | | |
|---|---|---|
| *H01L 21/02* | (2006.01) | |
| *H01L 29/36* | (2006.01) | |
| *H01L 29/737* | (2006.01) | |
| *H01L 29/732* | (2006.01) | |
| *H01L 29/08* | (2006.01) | |
| *H01L 29/66* | (2006.01) | |
| *H01L 29/10* | (2006.01) | |

(52) U.S. Cl.
CPC ...... *H01L 29/365* (2013.01); *H01L 21/02576* (2013.01); *H01L 21/02579* (2013.01); *H01L 21/02584* (2013.01); *H01L 29/0817* (2013.01); *H01L 29/1004* (2013.01); *H01L 29/66318* (2013.01); *H01L 29/7325* (2013.01); *H01L 29/7371* (2013.01); *H01L 21/0254* (2013.01); *H01L 21/02543* (2013.01); *H01L 21/02546* (2013.01); *H01L 21/02549* (2013.01)

(58) Field of Classification Search
CPC .......... H01L 21/0254; H01L 21/02543; H01L 21/02546; H01L 21/02576; H01L 21/02579
USPC ......................... 257/197; 438/309, 312, 325
See application file for complete search history.

(56) References Cited

U.S. PATENT DOCUMENTS

| | | | |
|---|---|---|---|
| 4,845,049 | A | 7/1989 | Sunakawa |
| 4,859,627 | A | 8/1989 | Sunakawa |
| 5,268,582 | A | 12/1993 | Kopf et al. |
| 5,270,224 | A | 12/1993 | Furumura et al. |

(Continued)

OTHER PUBLICATIONS

D. Cohen-Elias et al., "Formation of sub-10 nm width InGaAs finFETs of 200 nm height by atomic layer epitaxy," 71st Annual Device Research Conference (DRC), 2013, 2 pages.

(Continued)

*Primary Examiner* — Long K Tran
(74) *Attorney, Agent, or Firm* — Cantor Colburn LLP; Vazken Alexanian (57) ABSTRACT

A technique relates to a semiconductor device. A bipolar transistor includes an emitter layer and a base layer, where the emitter layer and the base layer are doped with an impurity, the impurity being a same for the emitter and base layers. The bipolar transistor includes a collector layer.

13 Claims, 8 Drawing Sheets

(56) References Cited

U.S. PATENT DOCUMENTS

| | | | |
|---|---|---|---|
| 5,329,145 | A | 7/1994 | Nakagawa |
| 5,594,750 | A | 1/1997 | Zhang et al. |
| 6,399,971 | B1 | 6/2002 | Shigematsu et al. |
| 6,873,029 | B2 | 3/2005 | He et al. |
| 7,067,898 | B1 | 6/2006 | Thomas, III et al. |
| 2006/0132237 | A1* | 6/2006 | Zochios .................. H03F 1/30 330/254 |
| 2013/0320402 | A1 | 12/2013 | Tsai et al. |
| 2017/0004969 | A1 | 1/2017 | Cohen et al. |

OTHER PUBLICATIONS

List of IBM Patents or Patent Applications Treated as Related; (Appendix P), Date Filed: May 21, 2019, 2 pages.

S. P. DenBaars et al., "GaAs/AlGaAs quantum well lasers with active regions grown by atomic layer epitaxy," Applies Physics Letters, vol. 51, No. 19, 1987, pp. 1530-1532.

Guy M. Cohen et al., "P-N Junction Based Devices With Single Species Impurity for Ptype and N-Type Doping," U.S. Appl. No. 16/049,027, filed Jul. 30, 2018.

Guy M. Cohen et al., "P-N Junction Based Devices With Single Species Impurity for Ptype and N-Type Doping," U.S. Appl. No. 16/750,157, filed Jan. 23, 2020.

List of IBM Patents or Patent Applications Treated as Related; (Appendix P); Date Filed: Jan. 23, 2020, 2 pages.

\* cited by examiner

P-N JUNCTION BASED DEVICES WITH SINGLE SPECIES IMPURITY FOR P-TYPE AND N-TYPE DOPING

DOMESTIC PRIORITY

This application is a divisional of U.S. patent application Ser. No. 16/049,027, filed Jul. 30, 2018, the disclosure of which is incorporated by reference herein in its entirety.

BACKGROUND

The present invention generally relates to fabrication methods and resulting structures for semiconductor devices, and more specifically, to P-N junction based devices with single species impurity for P-type and N-type doping.

A P-N junction is a boundary or interface between two types of semiconductor materials, P-type and N-type, inside a single crystal of semiconductor. The "P" (positive) side contains an excess of holes, while the "N" (negative) side contains an excess of electrons in the outer shells of the electrically neutral atoms. This allows electrical current to pass through the junction only in one direction. The P-N junction is created by doping, for example, by ion implantation, diffusion of dopants, or by in-situ doping during epitaxy (growing a layer of crystal doped with one type of dopant on top of a layer of crystal doped with another type of dopant). P-N junctions are elementary building blocks of semiconductor electronic devices such as diodes, bipolar transistors, field effect transistors, solar cells, light emitting diodes (LEDs), and integrated circuits. For example, a common type of transistor, the bipolar junction transistor, consists of two P-N junctions in series, in the form NPN or PNP. A diode can be made from a single P-N junction.

SUMMARY

Embodiments of the invention are directed to a bipolar transistor. A non-limiting example of the bipolar transistor includes an emitter layer and a base layer, where the emitter layer and the base layer are doped with an impurity, the impurity being a same for the emitter and base layers. Also, the bipolar transistor includes a collector layer.

Embodiments of the invention are directed to a method for forming a bipolar transistor. A non-limiting example of the method includes forming an emitter layer and forming a base layer, where the emitter layer and the base layer are doped with an impurity, the impurity being a same for the emitter and base layers. Also, the method includes forming a collector layer.

Embodiments of the invention are directed to a method of forming a P-N junction semiconductor device. A non-limiting example of the method includes forming an N-type semiconductor material of group III-V elements, where forming the N-type semiconductor material includes an impurity substituting only for group III elements in the group III-V elements. Also, the method includes forming a P-type semiconductor material so as to be positioned to the N-type semiconductor material, such that a P-N junction is formed.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, the known methods of forming a P-N junction use two different impurity species. For example, with III-V semiconductors such as GaAs or InAs, impurities such as Sn and/or Si are added during crystal growth to form an N-type doped region, while impurities such as Zn and/or Be are added during crystal growth to form a P-type doped region. As can be understood by one skilled in the art, certain impurities (also referred to as dopants) are N-type dopants while other impurities are P-type dopants. The need to use different impurity species for N-type dopants and P-type dopants introduces several challenges. First, it is difficult to form an abrupt P-N junction as some amount of diffusion typically occurs. This diffusion can occur during growth or later when the device is exposed to a high temperature. Second, doping memory effects (i.e., a residual amount of dopants that undesirably remain in the growth chamber), lead to unintentional doping in a semiconductor layer that is grown following a doped layer growth. As a result it is sometimes difficult to obtain low level of doping in a semiconductor layer that is grown following a layer with high doping levels.

Turning now to an overview of the aspects of the invention, one or more embodiments of the invention provide semiconductor devices and a method of forming the semiconductor devices. Embodiments of the invention present a method for the fabrication of P-N junctions using a single species impurity, i.e., a single dopant. The method uses the amphoteric properties of impurities in binary (as well as ternary or quaternary) semiconductors. For example, in III-V semiconductor material, group IV elements can be utilized as a dopant, and this dopant can be either a P-type or an N-type dopant. The doping polarity depends on whether the impurity atom substitutes or replaces a group III atom or a group V atom. For example, when a silicon (Si) impurity is used to dope gallium arsenide (GaAs), if the Si substitutes the Ga atom, the resulting doping will be N-type. On the other hand, if the Si impurity substitutes the As atom, the resulting doping will be P-type. Embodiments of the invention precisely control which of the atomic sites (group III or group V) the impurity substitutes for in the III-V semiconductor, in order to make a P-N junction with a single species impurity/dopant in both the P-type doped region and the N-type doped region.

In embodiments of the invention, atomic layer epitaxy (ALE)-based techniques are provided for both forming and in-situ doping a III-V semiconductor material, where the III-V semiconductor material is grown layer-by-layer, and where the dopant is selectively introduced during (or immediately before) formation of a particular one of the layers for which in-situ doping is desired. For amphoteric dopants such as group IV dopants, it can be difficult to control whether the dopant occupies a group-III site or a group-V site because auto-compensation can occur. According to embodiments of the invention, the dopant is selectively introduced when there is only either group-III or group-V sites available (but not both), thus effectively forcing the dopant to occupy a particular site, and generally eliminating the possibility for auto-compensation to occur. To use a simple example to illustrate this concept, if a layer containing a group V element(s) (a group V layer) is formed separately from another layer containing a group III element (s) (a group III layer), then in order to achieve n-type (n++) doping, the dopant can be selectively introduced only during growth of the group III layer. The dopant will thus be forced to occupy group-III sites because only group III vacancies are available to be populated with the dopant atom at the time of doping.

The term III-V semiconductor material (or simply III-V material), as used herein, refers to a material that includes at least one group III element and at least one group V element from the periodic table of elements. By way of example only, suitable III-V materials include, but are not limited to, one or more of aluminum gallium arsenide (AlGaAs), aluminum gallium nitride (AlGaN), aluminum indium arsenide (AlInAs), aluminum nitride (AlN), gallium antimonide (GaSb), gallium arsenide (GaAs), gallium nitride (GaN), indium antimonide (InSb), indium arsenide (InAs), indium gallium arsenide (InGaAs), indium gallium nitride (InGaN), indium nitride (InN), indium phosphide (InP), indium gallium arsenide phosphide (InGaAsP) and combinations including at least one of the foregoing materials. Likewise, reference will be made herein to group IV dopants. These are elements selected from group IV of the periodic table, such as silicon (Si) and tin (Sn).

Figure 1:
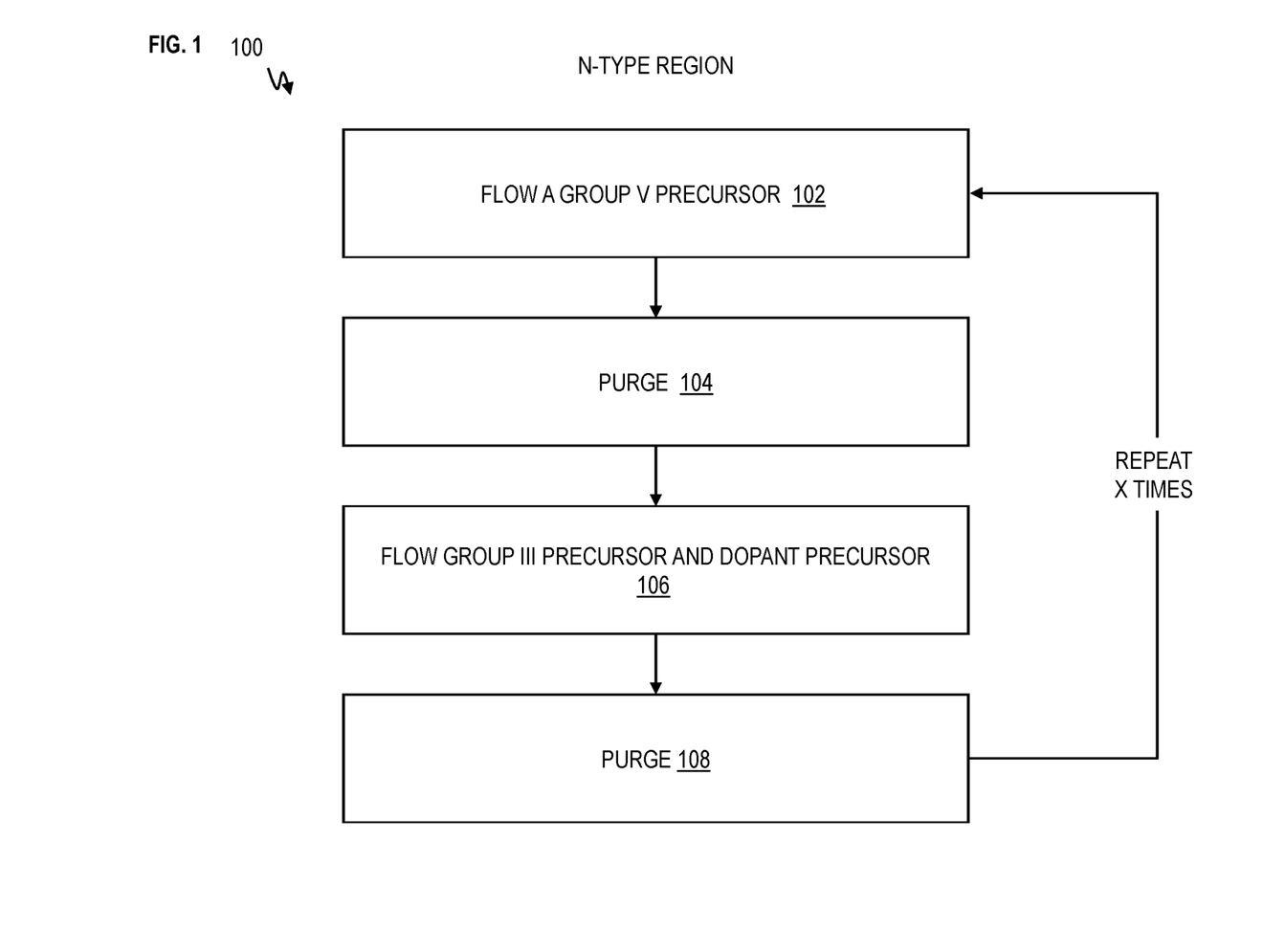
FIG. 1 depicts a flow chart for a method of growing an N-type region of an N-type III-V semiconductor material of a semiconductor device using atomic layer epitaxy (ALE) according to embodiments of the invention.
Figure 2:
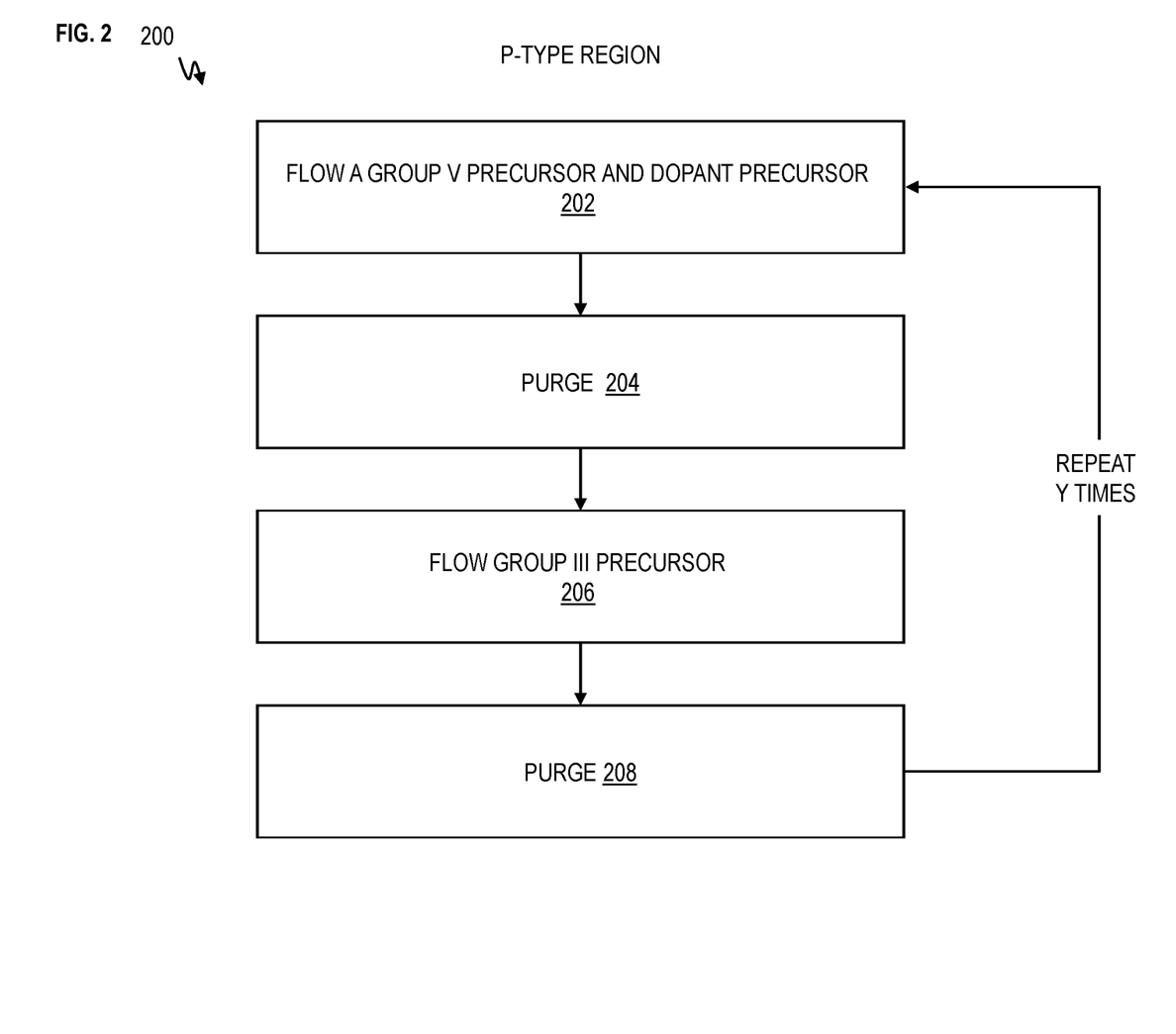
FIG. 2 depicts a flow chart for a method of growing a P-type region of a P-type III-V semiconductor material of the semiconductor device using ALE according to embodiments of the invention.
Figure 3:
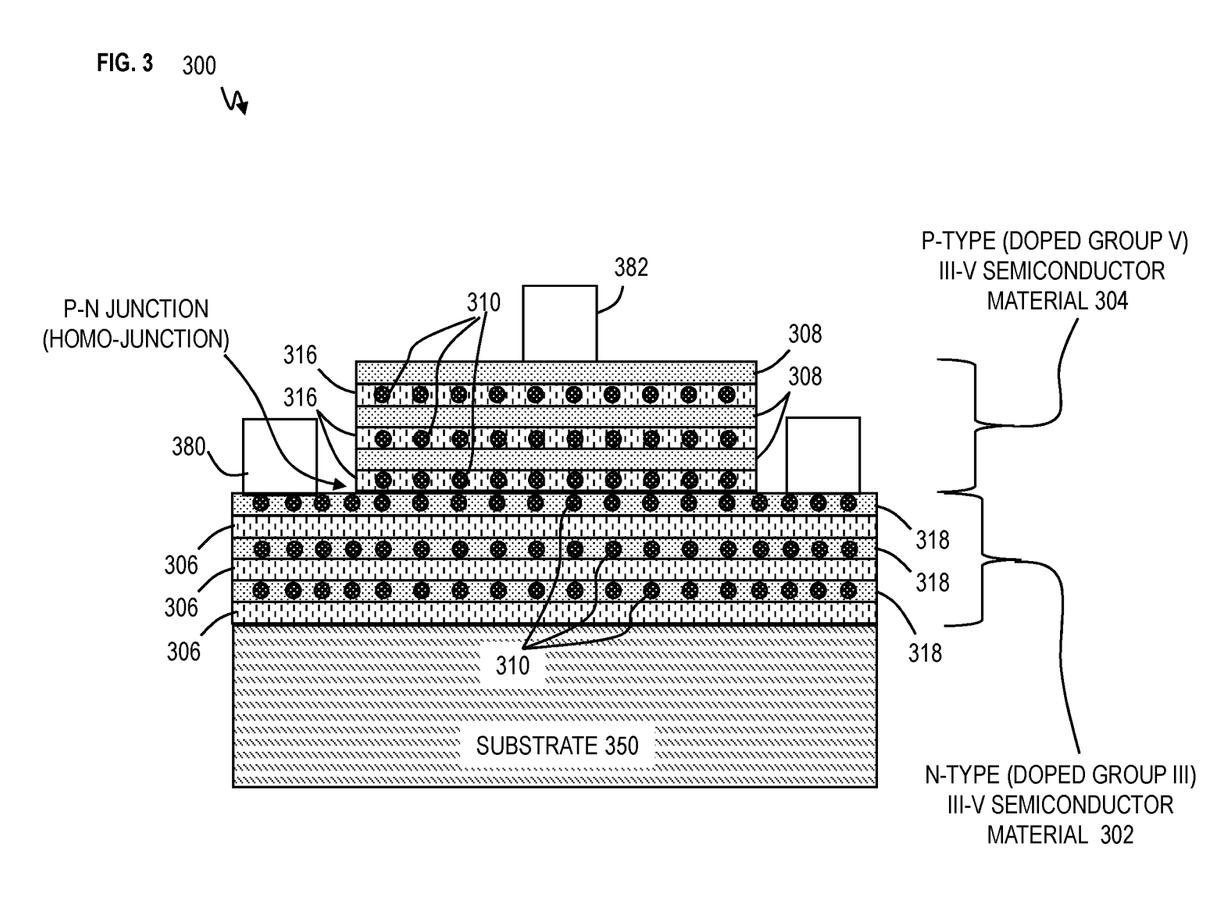
FIG. 3 depicts a cross-sectional view of the semiconductor device according to embodiments of the invention.

Turning now to a more detailed description of aspects of the present invention, FIG. 1 is a flow chart of a method 100 of growing an N-type region of the N-type III-V semiconductor material of a semiconductor device 300 (shown in FIG. 3) using atomic layer epitaxy (ALE) according to embodiments of the invention. FIG. 2 is a flow chart of a method 200 of growing a P-type region of the P-type III-V semiconductor material of the semiconductor device 300 using ALE according to embodiments of the invention. FIG. 3 depicts a cross-sectional view of the semiconductor device 300 according to embodiments of the invention. The semiconductor device 300 is an example of a P-N junction based device with single species impurity for both P-type and N-type doping.

With growth methods such as metal-organic chemical vapor deposition (MOCVD) or molecular beam epitaxy (MBE), the choice of the substitutional site is determined by the Gibbs free energy ($\Delta G_S$). The Gibbs free energy expresses the sum of the formation energy and change in entropy that the system experiences during the incorporation of an impurity on a group III or a group V site. The ratio of impurities substituting a group V atom to impurities substituting a group III atom is given by the energy factor=$e^{-\Delta G_S/kT}$. The energy factor primarily depends on the properties of the impurity and the semiconductor it is doping. A second factor is the kinetic factor which is the ratio of group V to group III vacancies. The kinetic factor depends on growth conditions such as the V/III flux ratio. While the growth temperature and the V/III flux ratio can be changed during growth to control the group V to group III substitutional occupation of an amphoteric impurity, these knobs have limited impact. For example, carbon (C) is reported to be a P-type dopant in GaAs in nearly all practical growth conditions. As a result, the formation of a P-N junction requires the use of two different impurity atoms in the state-of-the-art growth methods. For example, in GaAs, the P-type region is doped with zinc (Zn) or carbon, while the N-type region is doped with silicon (Si) or tin (Sn). In view of the issues presented above by state-of-the-art growth methods, a new growth method is presented. To form the P-N junction, atomic layer epitaxy (ALE) is used with the sequence detailed below in the example processes discussed in FIGS. 1 and 2. FIGS. 1 and 2 discuss growth of a P-N junction where the III-V semiconductor material is InAs and the (single) group IV dopant is Si. It should be appreciated that this example is only for explanation purposes. Other III-V semiconductor materials and group IV dopants can be utilized.

Referring now to the method 100 shown in FIG. 1 and the semiconductor device 300 shown in FIG. 3, the method 100 is configured and arranged to grow X layers of the N-type III-V semiconductor material 302 by repeating the cycle below X times, where X is an integer number. The method 100 includes flowing a group V precursor, such as, for example $AsH_3$, at block 102. This forms an atomic monolayer 306 of the group V material without any dopants. The atomic monolayer 306 can be formed on the substrate 350. Although ALE can be used to grow a first group III or group V monolayer 306, this example uses a group V material for explanation purposes. The processes of method 100 are carried out in a reaction vessel or chamber which separates the reactants either spatially or temporarily. At block 104, the chamber or reaction vessel is purged with a gas, for example, by flowing $H_2$. After the monolayer 306 is grown (as well as other monolayers, excess reactants are removed.

The method 100 further includes flowing a group III precursor and dopant precursor, such as, for example TMIn+ $SiH_4$, at block 106. This forms an atomic monolayer 318 of the group III material with dopants 310 on top of the atomic monolayer 306. In this example, the dopants 310 are Si but it should be appreciated that other types of group IV dopants can be used. At block 108, the chamber or reaction vessel is purged by, for example, flowing $H_2$. The monolayers 306 and 318 are alternately stacked such that only the monolayers 318 contain the dopants 310 in the N-type region 302 of the semiconductor device 300, as depicted in FIG. 3. As noted above, this cycle is repeated X times to atomically grow X layers (i.e., monolayers 306 and 318) of the N-type III-V semiconductor material 302 in the semiconductor device 300.

Referring now to the method 200 in shown FIG. 2 and the semiconductor device 300 shown in FIG. 3, the method 200 is configured and arranged to grow Y layers of the P-type III-V semiconductor material 304 by repeating the cycle below Y times, where Y is an integer number. At block 202, the method 200 includes flowing a group V precursor and dopant precursor, such as, for example, $AsH_3+SiH_4$. This forms an atomic monolayer 316 of the group V material with the dopants 310 on top of the atomic monolayer 318. The dopants 310 (e.g., Si) are the same in both the group V atomic monolayer 316 and the group III monolayer 318.

At block 204, the chamber or reaction vessel is purged, for example, by flowing $H_2$. At block 206, the method 200 further includes flowing a group III precursor, such as, for example, trimethylindium (TMIn). This forms an atomic monolayer 308 of the group III material without any dopants on top of the group V atomic monolayer 316.

At block 208, the chamber or reaction vessel is purged by, for example, flowing $H_2$. The monolayers 308 and 316 are alternately stacked such that only the monolayers 316 contain the dopants 310 in the P-type region 304 of the semiconductor device 300, as depicted in FIG. 3. As noted above, this cycle is repeated Y times to atomically grow Y layers of the P-type III-V semiconductor material 304 of the semiconductor device 300, so as to be adjacent to the N-type III-V semiconductor material 302.

According to embodiments of the invention, the use of ALE growth enables a selective population of the impurity atom on a group III site (e.g., resulting in group III monolayers 318 of the N-type semiconductor material 302) or a group V site (such as, e.g., resulting in group V monolayers 316 of the P-type semiconductor material 304). For N-type doping of the semiconductor device 300, the amphoteric impurity is introduced together with group III atoms as discussed in FIG. 1. When group V atoms are deposited, the impurity is not present in FIG. 1, and as a result, only group III substitution can occur. Analogously, for P-type doping of the semiconductor device 300, the amphoteric impurity is introduced together with group V atoms, but deposition of group III atoms takes place without the impurity being present as discussed in FIG. 2. This growth method in FIGS. 1 and 2 is different than state-of-the-art methods, such as MOCVD or MBE, where the precursors for group III, group V, and the impurity are introduced simultaneously during the entire duration of the semiconductor growth. One or more contacts 380 can be formed on the N-type III-V semiconductor material 302 and one or more contacts 382 can be formed on the P-type III-V semiconductor material 304. The contacts 380 and 382 are terminals for current flow and applying voltage to the semiconductor device 300. The contacts 380 and 382 can be metals including, for example, nickel, titanium, tungsten, etc.

According to embodiments of the invention, the resulting P-N junction (e.g., in FIG. 3) formed by ALE as outlined above has two particular properties. 1) Only one (group IV) impurity species is used for both N-type and P-type doping. For example, the same (single) impurity is used to dope both the both the N-type and P-type regions 302 and 304, respectively. More particularly, the same impurity (e.g., dopant 310) is used to dope the monolayers 316 and 318. 2) The resulting P-N junction is atomically abrupt. This means that the there is no diffusion or bleeding of the dopants 310 between doped monolayers 316 and 318 at the P-N junction, and there is a definitive demarcation between the P-type side and N-type side of the semiconductor device 300 at the interface between the upper most doped monolayer 318 and the bottom most doped monolayer 316, in this example.

It should be noted that the stacking of group III and group V as monolayers is not possible for all crystal orientations. Particularly, what occurs in ALE is that the dopants are directed to replace (substitute) only group III atoms or replace (substitute) only group V atoms according to embodiments of the invention. It can be possible in some crystal orientations (such as 110) that the monolayers will contain both group V and group III atoms, however, the substitution with dopants only occurs within one group (group III or group V) selectively. The illustrative use of monolayers containing only group V and group III atoms is for ease of understanding and explanation purposes, thereby making it simpler to recognize that the substitution with dopants only occurs within one group (either group III or group V) selectively.

Using ALE, sources for vapor phase epitaxy of group III-V materials are known in the art. By way of example and not limitation, trimethylindium (TMIn) and trimethylgallium (TEGa) are suitable organometallic sources for vapor phase epitaxy of In and Ga, respectively, and tertiarybutylarsine (TBA) and tertiarybutylphosphine (TBP) are suitable sources for vapor phase epitaxy of As and P, respectively. Other precursors such as arsine ($AsH_3$) and phosphine ($PH_3$) can be used for supplying the group V elements. Trimethylsilane, silane ($SiH_4$), disilane ($SiH_6$), silicon tetrabromide ($SiBr_4$) and silicon tetrachloride ($SiCl_4$), for example, are suitable sources for vapor phase epitaxy of the dopant Si. Tetraethyltin $Sn(C_2H_5)_4$ and tetramethyltin $Sn(CH_3)_4$, for example, are suitable sources for vapor phase epitaxy of the dopant Sn. Germane $GeH_4$ is a suitable source for vapor phase epitaxy of the dopant Ge. Carbon tetrabromide ($CBr_4$) is a suitable source for vapor phase epitaxy of the dopant C.

By way of example and not limitation, the substrate 350 can be contacted with the group III or group V materials, a growth temperature of from about 300° C. to about 500° C. can be used, and dopant source(s) and/or III-V precursors are applied for a duration of from about 1 second to about 20 seconds, in each ALE cycle.

Furthermore, sources for vapor phase epitaxy of group III-V materials such as indium (In), gallium (Ga), arsenic (As), aluminum (Al), antimony (Sb), nitrogen (N), etc., are known in the art. By way of example and not limitation, trimethylindium, trimethylgallium (or triethylgallium), and trimethylaluminum (TMAl) are suitable organometallic sources for vapor phase epitaxy of group III elements indium, gallium, and aluminum, respectively. Tertiary butyl arsine (TBA) is a suitable source for vapor phase epitaxy of the group V element arsenic (As), and tertiary butyl phosphine (TBP) is a suitable source for vapor phase epitaxy of the group V element phosphorous (P). Trimethylantimony (TMSb) and triethylantimony (TESb) are suitable sources for vapor phase epitaxy of the group V element antimony (Sb), and ammonia ($NH_3$) and hydrazine ($N_2H_4$) are suitable sources for vapor phase epitaxy of the group V element nitrogen (N).

It is noted that multiple group III (or group V) elements can be introduced together, so long as there is no intermixing of group III and group V elements in the same monolayer.

Referring now to FIG. 3, by using the techniques discussed herein to form the semiconductor device 300 which is P-N junction based device (such as a diode), other P-N junction based devices can be formed. For example, a bipolar junction transistor (bipolar transistor or BJT) is a type of transistor that uses both electron and hole charge carriers. For their operation, BJTs use two junctions between two semiconductor types, N-type and P-type. BJTs are manufactured in two types, NPN and PNP, and are available as individual components. A BJT consists of three differently doped semiconductor regions: the emitter region, the base region, and the collector region. These regions are respectively P– type, N-type, and P-type in a PNP transistor, and N– type, P-type, and N-type in an NPN transistor. Each semiconductor region is connected to a terminal, appropriately labeled: emitter (E), base (B) and collector (C).

Figure 4:
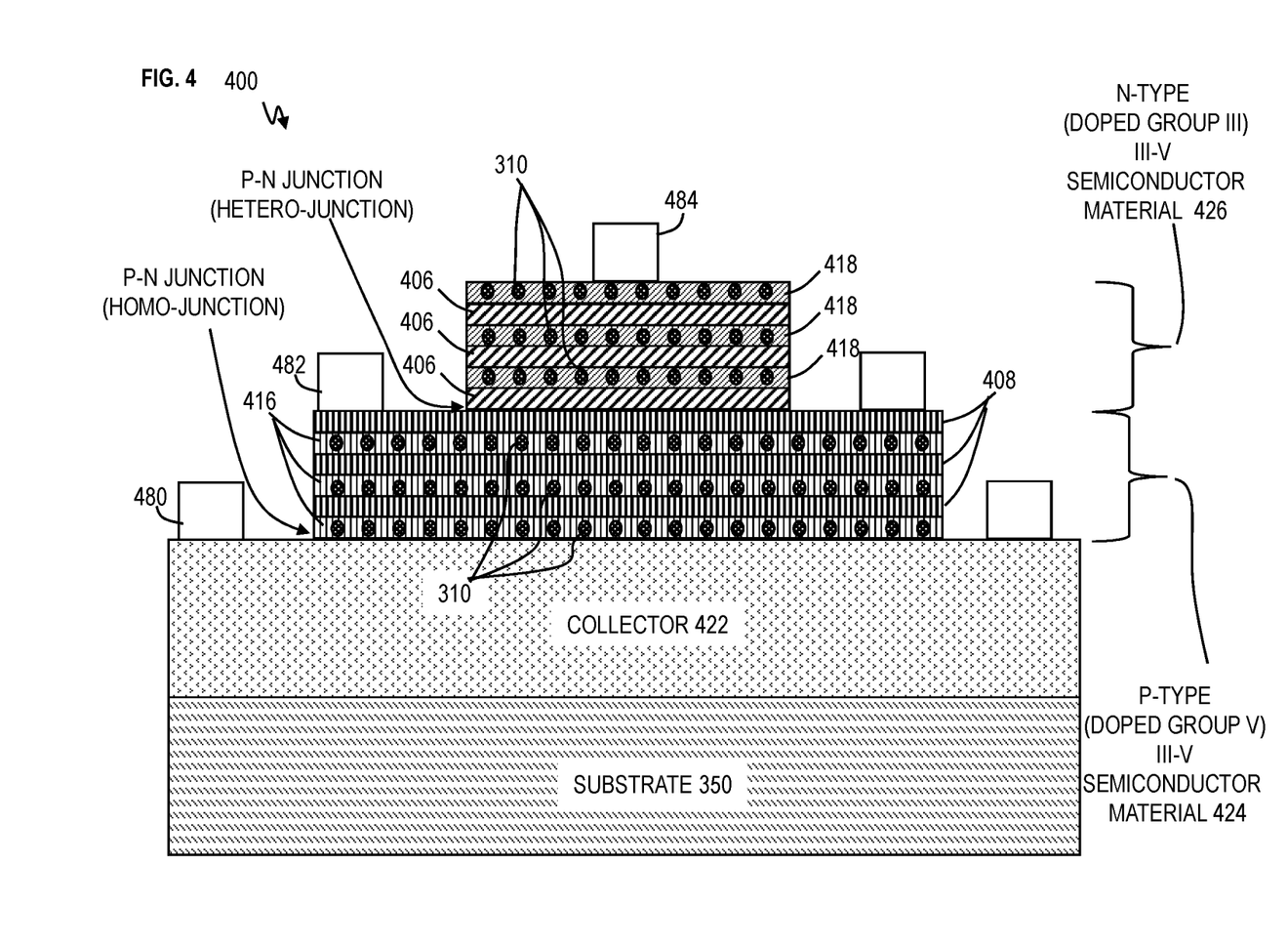
FIG. 4 depicts a cross-sectional view of a hetero junction bipolar transistor (HBT) according to embodiments of the invention.

FIG. 4 depicts a cross-sectional view of a hetero junction bipolar transistor (HBT) 400 according to embodiments of the invention. HBTs use a large band gap material to form the emitter and a smaller bandgap material to form the base. In other words, two different semiconductor materials are used for the emitter and base. The heterojunction forms a barrier ($\Delta E_v$) for holes (for NPN devices), which allows the base doping to be higher than the emitter doping. The high doping of the base reduces the base resistance, without reducing the gain because hole injection is blocked by the heterojunction. For example, a HBT can be formed using an N-type InP emitter, a heavily doped (p++) P-type InGaAs base, and an N-type InGaAs emitter. In this example, the emitter can be doped with Sn or Si, while the base is doped with Be or C. One of the issues with HBTs is that if diffusion of the dopant takes place the P-N junction will no longer align with the hetero-junction (i.e., the physical junction between the two different materials of the emitter and base) and the HBT operation will be impaired.

When the HBT has a P-N junction formed using the growth method discussed herein, the P-N junction is effectively self-aligned with the hetero-junction. More specifically, the following growth sequence can be performed to fabricate the HBT 400 according to embodiments of the invention. Referring to FIG. 4, the HBT 400 includes a collector 422 (or collector region), a base 424 (or base region), and emitter 426 (or emitter region). In this example, the HBT 400 is a III-V semiconductor device that is an NPN transistor. Analogously, the HBT 400 could be a PNP transistor by growing a P-type region, next an N-type region, and then a P-type region. In HBT 400, the collector 422 and base 424 are the same III-V semiconductor material, while the emitter 426 is a different III-V semiconductor material from the base 424. For example, the collector 422 can be N-type InGaAs, the base 424 can be heavily doped P-type InGaAs, and the emitter 426 can be N-type InP. It is noted that to reduce contact resistance to the emitter a thin layer (not shown) of a lower band gap semiconductor (such as n++InGaAs for NPN HBT) is grown on top of the emitter layer 426. This lower band gap semiconductor can be grown by ALE or MOCVD.

Collector growth of the N-type InGaAs is now discussed. The collector P-N junction (between collector 422 and base 424) is a homo-junction because the collector 422 and base 424 are made of the same III-V semiconductor material. As such, any growth method in the state-of-the-art can be used to form collector 422, such as MOCVD. As an example, the collector 422 can be formed by using TMIn as the In precursor, triethylgallium (TEGa) as the Ga precursor, and $AsH_3$ as the As precursor to form InGaAs as the III-V semiconductor material, while using $SiH_4$ or $SiBr_4$ as the Si dopant source.

Figure 5:
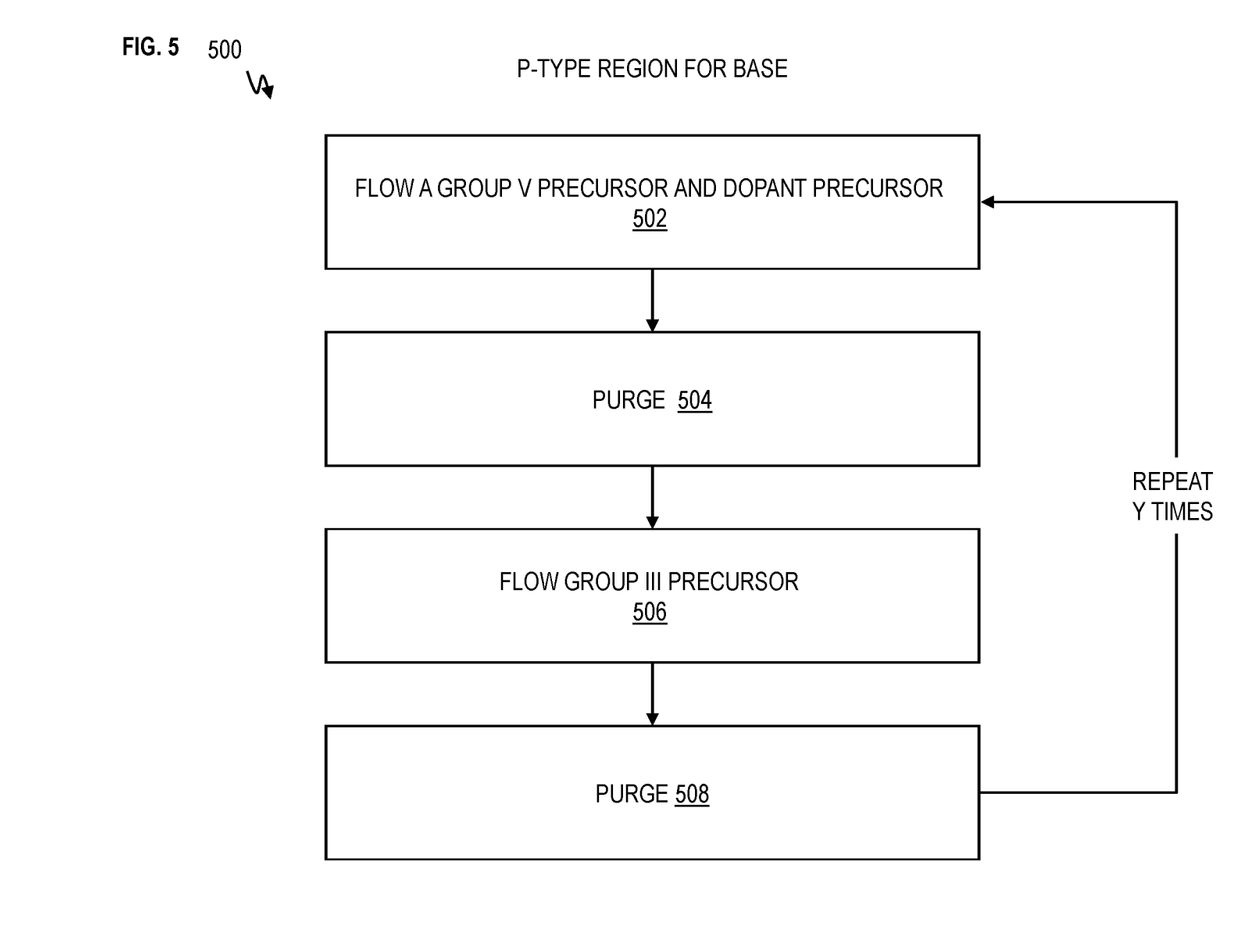
FIG. 5 depicts a flow chart for a method of growing P-type III-V semiconductor material as the base for the semiconductor device in FIG. 4 using ALE according to embodiments of the invention.

For the base growth of the heavily doped (p++) P-type InGaAs, forming the base 424 is analogous to FIG. 2. Similar to FIG. 2, FIG. 5 depicts a flow chart of a method 500 of growing P-type III-V semiconductor material as the base 424 of the semiconductor device 400 using ALE according to embodiments of the invention. For example, to form the P-type region of HBT 400, the method 500 includes growing Y layers of P-type III-V semiconductor material by repeating the following cycle Y times, where Y is an integer number. At block 502, growing the base 424 includes flowing a group V precursor and dopant precursor, such as, for example, $AsH_3$+$CBr_4$. This forms atomic monolayer 416 of group V material with dopants 310. In this example, the group V material is As and the dopants 310 are carbon (C). The atomic monolayer 416 is formed on top of the collector 422.

At block 504, growing the base 424 includes purging the chamber or reactant vessel, for example, by flowing a gas such as $H_2$. At block 506, growing the base 424 includes flowing a group III precursor, such as, for example, TMIn+TEGa. This forms atomic monolayer 408 of group III material, for example, InGaAs. The atomic monolayer 408 is formed on top of the atomic monolayer 416.

At block 508, the chamber is again purged, for example, by flowing $H_2$, which is in preparation to form the next atomic monolayer. The monolayers 408 and 416 are alternatingly stacked to form base 424 such that only the monolayers 416 contain the dopants 310 while monolayers 408 are free of the dopants 310, as depicted in the HBT 400 of FIG. 4. As noted above, this cycle is repeated Y times to atomically grow Y layers of the (InGaAs) P-type III-V semiconductor material of base 424.

Figure 6:
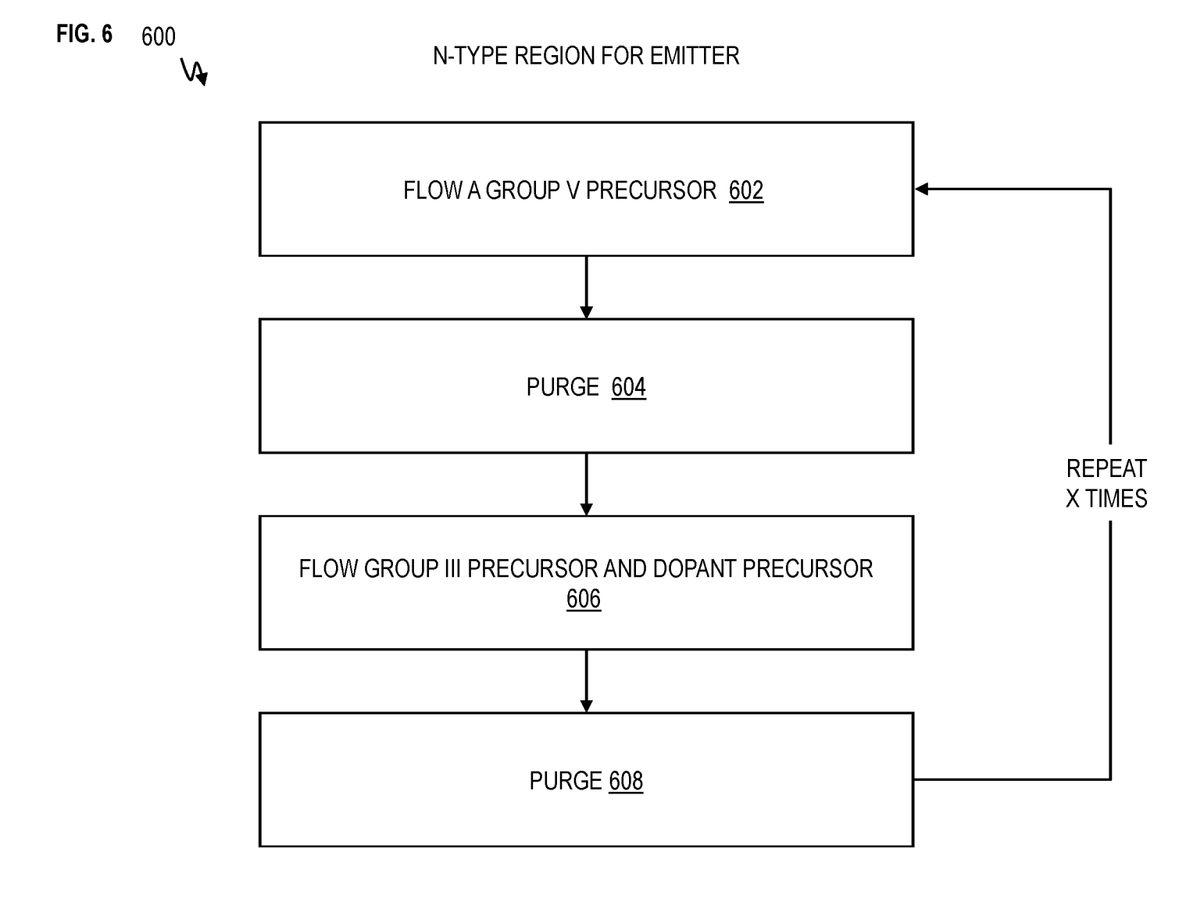
FIG. 6 depicts a flow chart for a method of growing the N-type III-V semiconductor material as the emitter of the semiconductor device in FIG. 4 using ALE according to embodiments of the invention.

For the emitter growth of N-type InP, forming the emitter 426 is analogous to FIG. 1. FIG. 6 is a flow chart of a method 600 of growing the N-type III-V semiconductor material as the emitter 426 of the semiconductor device 400 using ALE according to embodiments of the invention. For example, to form the N-type region, the method 600 includes growing X layers of N-type III-V semiconductor material by repeating the following cycle X times, where X is an integer number.

At block 602, growing the emitter 426 includes flowing a group V precursor, such as, for example, $PH_3$. This forms atomic monolayer 406 with no dopants. In this example, the group V semiconductor material is P. The atomic monolayer 406 is formed on top of the base 424.

At block 604, growing the emitter 426 includes purging the chamber or reactant vessel, for example, by flowing Hz. At block 606, growing the emitter 426 includes flowing the group III precursor and dopant precursor, such as, for example, $TMIn+CBr_4$. This forms the atomic monolayer 418 with dopants 310. In this example, the group III semiconductor material is In and the dopants are C in atomic monolayer 418. The atomic monolayer 418 is formed on top of the atomic monolayer 406. At block 508, the chamber or reactant vessel is again purged, for example, by flowing $H_2$, which is in preparation to form the next atomic monolayer.

The monolayer 406 and 418 are alternatingly stacked to form emitter 426 such that only the monolayers 418 contain dopants 310 while the monolayers 406 are free of dopants 310, as depicted in HBT 400 of FIG. 4. As noted above, this cycle is repeated X times to atomically grow X layers of the N-type III-V semiconductor material of emitter 426.

One or more contacts 480 are formed on the collector 422, one or more contacts 482 are formed on the base 424, and one or more contacts 484 are formed on the emitter 426. The contact 480, 482, and 426 are terminals for the HBT 400 and can include metal, such as, nickel, titanium, platinum, etc. It should be appreciated that metallization to P-type material can be different than to N-type material. As can be seen in the HBT 400, the doped monolayers 416 and 418 are doped with the same impurity, even while the base 424 and emitter 426 are two different types of III-V semiconductor materials and two different polarities (P-type and N-type, respectively). Typically the HBT layers are grown as blanket layers (or in selected regions) and then using lithography and etching the collector, base and emitter mesa are defined. So HBT 400 with the contacts is the structure following the definition of the collector, base, and emitter regions by lithography and etching, and formation of the contacts to these regions by methods such as metal evaporation or metal sputtering (physical vapor deposition).

The monolayers discussed herein are grown under suitable conditions, including temperatures, pressure, time, etc., as understood by one skilled in the art.

Figure 7A:
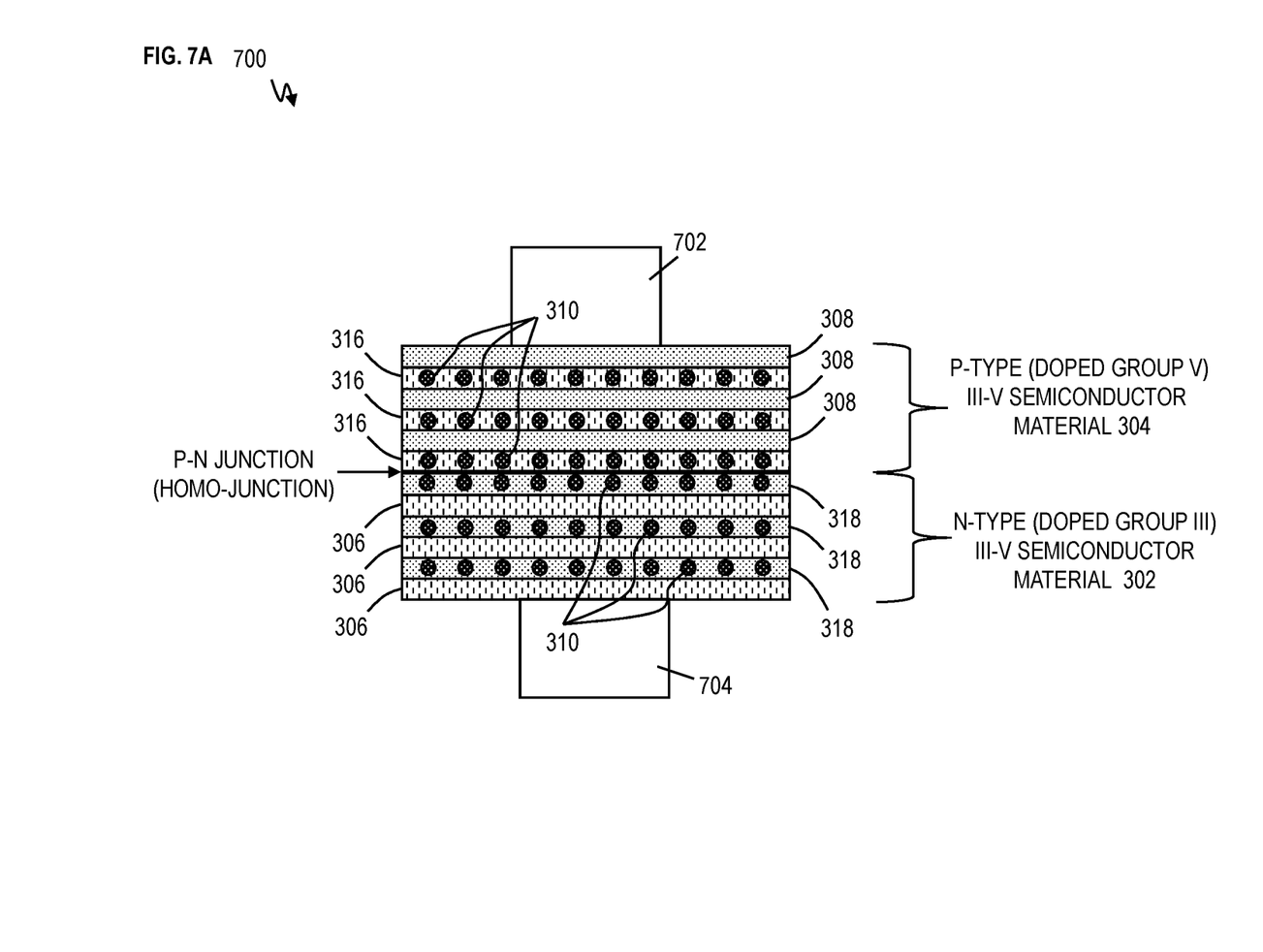
FIG. 7A depicts a semiconductor device with a P-N junction prior to a "blown" fuse according to embodiments of the invention.
Figure 7B:
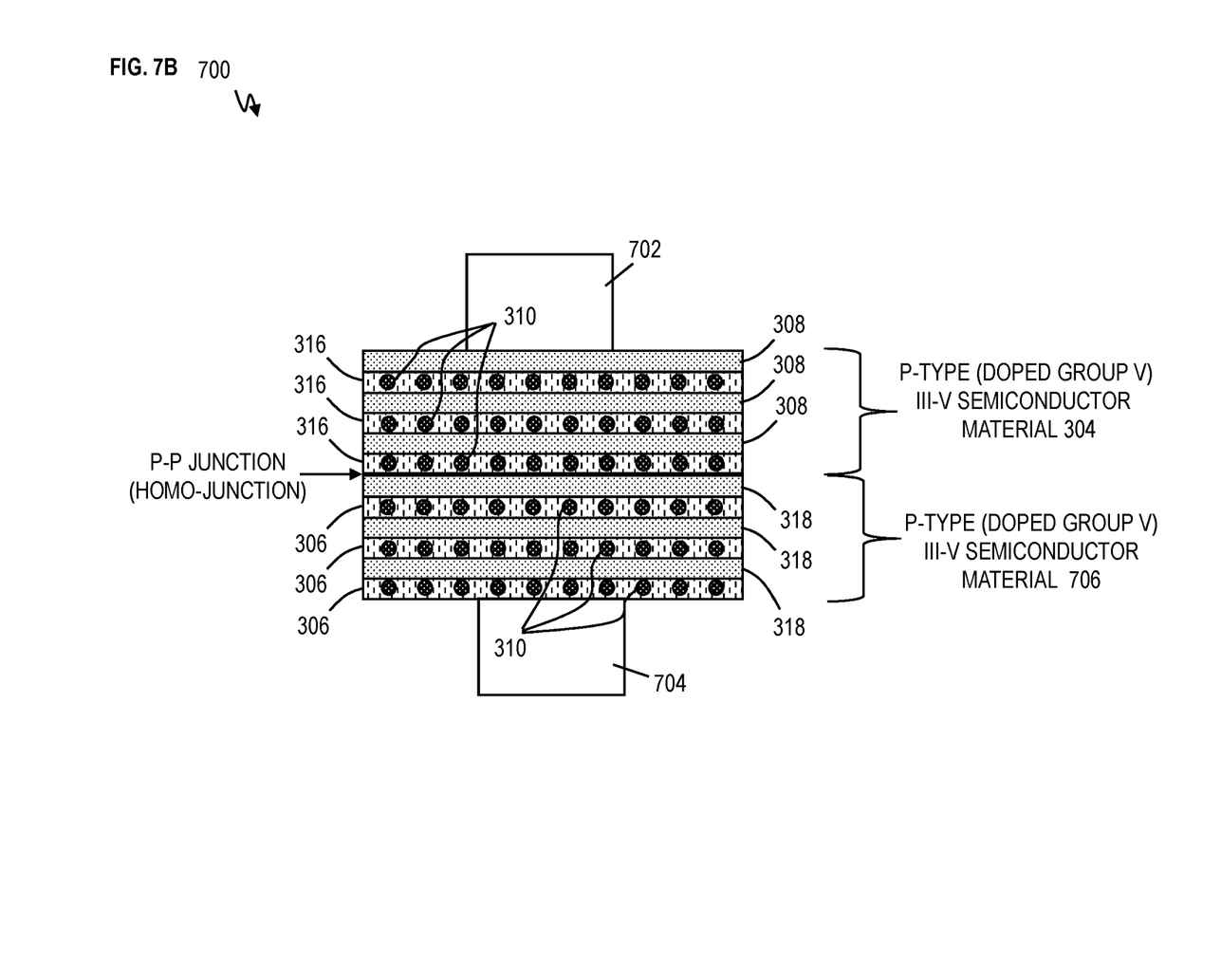
FIG. 7B depicts the semiconductor device in FIG. 7A with a P-P junction after a "blown" fuse according to embodiments of the invention.

Embodiments of the invention can be utilized as a temperature sensitive fuse. FIG. 7A depicts a semiconductor device 700 with a P-N junction prior to a "blown" fuse according to embodiments of the invention. FIG. 7B depicts the semiconductor device 700 with a P-P junction after a "blown" fuse according to embodiments of the invention.

FIG. 7A illustrates dopants 310 in the group III monolayers 318 but not in the group V monolayers 306, thereby forming the N-type III-V semiconductor material 302. Also, FIG. 7A illustrates dopants 310 in the group V monolayers 316 but not in the group III monolayers 308, thereby forming the P-type III-V semiconductor material 304. Above a predefined threshold temperature, FIG. 7B illustrates that the dopants 310 have migrated from group III monolayers 318 to the group V monolayers 306, thereby changing the N-type III-V semiconductor material 302 into P-type III-V semiconductor material 706. As such, the semiconductor device 700 represents a "blown" fuse in FIG. 7B, which has conductance characteristic of a resistor where the pre-blown (fuse) semiconductor device 700 in FIG. 7A has a conductance characteristic of a rectifying P-N junction. The different conductance characteristic of the semiconductor device 700 in FIG. 7A and in FIG. 7B can be measured via (metal) contacts 702 and 704. More details regarding the semiconductor device 700 as a temperature sensitive fuse is discussed further below.

The chemical formation energies of an amphoteric impurity are different for group III and group V occupation. When the difference in the formation energy for a dopant to occupy a group III versus occupying a group V is very large, the dopant can "relax" into the lower energy arrangement during an anneal. Using this principle, a P-N junction can be wiped out when the semiconductor device 700 is exposed to a temperature above a threshold temperature. The threshold temperature depends both on the III-V material and the dopant element. For example, for InAs the threshold temperature is typically from about 450 C to 550 C where for GaAs the threshold temperature is above 550 C. For example, if P-type doping provides the lower energy arrangement, the N-type doping will relax upon annealing and convert into a P-type region. The P-N junction (depicted in FIG. 7A) effectively turns into a P-P junction (depicted in FIG. 7B) which no longer can rectify the current and has the properties of an ordinary resistor. Thus, this P-N junction device (i.e., semiconductor device 700) can be used as temperature sensor that does not require power (e.g., being connected to a power supply or battery in order to operate as a temperature sensitive fuse) and that remembers if a surrounding temperature exceeded some threshold temperature. If the device temperature was kept below the threshold temperature, the semiconductor device 700 will exhibit a rectifying characteristics when measured as depicted in FIG. 7A. However, when the surrounding temperature exceeds the threshold temperature, the semiconductor device 700 will show simple resistor characteristics because the P-N junction has been wiped out by the exposure as depicted in FIG. 7B. The resistance as measured via contacts 702 and 704 across the P-P junction will be mostly independent of the voltage in FIG. 7B. Furthermore, it is noted that the P-N junction has an I-V (current to voltage) characteristic that is rectifying. So in one voltage polarity, it will have low resistance and in the opposite polarity it will be very high resistance. However, the P-P junction (i.e., "blown" fuse) has a characteristic of a resistor which is nearly independent of the voltage polarity.

A method of forming a bipolar transistor 400 is provided. The method includes forming an emitter layer 426, and a base layer 424, where the emitter layer 426 and the base layer 424 are doped with an impurity (e.g., dopant 310), the impurity being a same for the emitter and base layers. The method includes forming a collector layer 422.

The base layer 424 and the emitter layer 426 include group III-V elements. The impurity (e.g., dopant 310) substitutes only group V elements in the base layer (as depicted by layers 416), and the impurity (e.g., same dopant 310) substitutes only group III elements in the emitter layer (as depicted by layers 418). It is noted that "substitute only" is by design according to embodiments of the invention, and even in cases where the manufacturing process tolerances or outcome may be "mostly substitute", "mostly substitute" is still sufficient to produce the N-type and/or P-type materials as discussed herein according to embodiments of the invention. The collector layer 422 is an N-type region, the base layer is a P-type region, and the emitter layer is an N-type region, thereby forming an NPN transistor (as depicted in FIG. 4). The group III-V elements in the base layer 424 are different from the emitter layer 426. The collector layer 422 includes the group III-V elements which are the same as the base layer 424.

Alternatively, the impurity (e.g., dopant 310) substitutes only group III elements in the base layer (e.g., in an implementation when base layer 424 is N-type instead of P-type), and the impurity (e.g., dopant 310) substitutes only group V elements in the emitter layer (e.g., in an implementation when the emitter 426 is P-type instead of N-type, which means the collector would be P-type in this example). The collector layer is a P-type region, the base layer is an N-type region, and the emitter layer is a P-type region, thereby forming a PNP transistor. The group III-V elements in the base layer are different from the emitter layer. The collector layer includes the group III-V elements which are a same as the base layer.

The emitter layer, the base layer, and the collector layer form a hetero-junction bipolar transistor.

According to embodiments of the invention, a method of forming a temperature sensitive semiconductor device 700. The method includes forming an N-type semiconductor material 302 of group III-V elements, forming the N-type semiconductor material includes an impurity (e.g., dopant 310) substituting only for group III elements in the group III-V elements (e.g., layers 318 doped with dopant 310 in FIG. 7A). The method includes forming a P-type semiconductor material 304 so as to be positioned on the N-type semiconductor material 302, such that a P-N junction is formed. A switch to a P-P junction in FIG. 7A from the P-N junction in FIG. 7A is defined to occur at a predefined temperature.

The switch to the P-P junction in FIG. 7B is formed by the impurity (e.g., group IV dopants 310) migrating from substituting the group III elements (e.g., layers 318 in FIG. 7A) to substituting for group V elements (e.g., layer 306 in FIG. 7B) in the group III-V elements, thereby converting the N-type semiconductor material 302 from N-type to P-type (i.e., to P-type semiconductor material 706 in FIG. 7B).

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a bipolar transistor, the method comprising: forming an emitter layer;
    forming a base layer, wherein the emitter layer and the base layer are doped with an impurity, the impurity being a same for the emitter and base layers;
    forming a collector layer;
    wherein the base layer and the emitter layer comprise group III-V elements; and
    wherein the impurity substitutes only group V elements in the base layer, and the impurity substitutes only group III elements in the emitter layer.

2. The method of claim 1, wherein the collector layer is an N-type region, the base layer is a P-type region, and the emitter layer is an N-type region, thereby forming an NPN transistor.

3. The method of claim 1, wherein the impurity comprises silicon (Si).

4. The method of claim 1, wherein the impurity comprises tin (Sn).

5. The method of claim 1, wherein the group III-V elements in the base layer are different from the emitter layer.

6. The method of claim 5, wherein the collector layer comprises the group III-V elements which are a same as the base layer.

7. The method of claim 1, wherein the impurity substitutes only group III elements in the base layer, and the impurity substitutes only group V elements in the emitter layer.

8. The method of claim 7, wherein the collector layer is a P-type region, the base layer is an N-type region, and the emitter layer is a P-type region, thereby forming a PNP transistor.

9. The method of claim 8, wherein the group III-V elements in the base layer are different from the emitter layer.

10. The method of claim 9, wherein the collector layer comprises the group III-V elements which are a same as the base layer.

11. The method of claim 1, wherein the emitter layer, the base layer, and the collector layer form a hetero-junction bipolar transistor.

12. The method of claim 1, wherein the group III-V elements are selected from the group consisting of aluminum gallium arsenide (AlGaAs), aluminum gallium nitride (AlGaN), aluminum indium arsenide (AlInAs), aluminum nitride (AlN), gallium antimonide (GaSb), gallium arsenide (GaAs), gallium nitride (GaN), indium antimonide (InSb), indium arsenide (InAs), indium gallium arsenide (InGaAs), indium gallium nitride (InGaN), indium nitride (InN), indium phosphide (InP), and indium gallium arsenide phosphide (InGaAsP).

13. The method of claim 1, wherein the impurity comprises a group IV element.

* * * * *